(12) United States Patent
Hwang et al.

(10) Patent No.: US 11,151,949 B2
(45) Date of Patent: Oct. 19, 2021

(54) DISPLAY APPARATUS AND METHOD OF DRIVING DISPLAY PANEL USING THE SAME

(71) Applicant: Samsung Display Co., Ltd., Yongin-Si (KR)

(72) Inventors: Jong-Kwang Hwang, Asan-si (KR); Byung Soo You, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/028,056

(22) Filed: Sep. 22, 2020

(65) Prior Publication Data

US 2021/0090507 A1 Mar. 25, 2021

(30) Foreign Application Priority Data

Sep. 23, 2019 (KR) .................. 10-2019-0116809

(51) Int. Cl.
*G09G 3/3291* (2016.01)
*H01L 27/32* (2006.01)
*G09G 3/3233* (2016.01)
*G09G 3/3208* (2016.01)

(52) U.S. Cl.
CPC ....... *G09G 3/3291* (2013.01); *H01L 27/3276* (2013.01); *G09G 2320/0233* (2013.01)

(58) Field of Classification Search
CPC .. G09G 3/3233; G09G 3/3291; G09G 3/3208; G09G 3/3258; G09G 3/3225; H01L 27/3276
See application file for complete search history.

(56) References Cited

U.S. PATENT DOCUMENTS

| 7,348,942 | B2 | 3/2008 | Jo | |
| 8,022,907 | B2* | 9/2011 | Park | G09G 3/3225 |
| | | | | 345/77 |
| 8,330,684 | B2* | 12/2012 | Park | G09G 3/3233 |
| | | | | 345/82 |
| 9,053,664 | B2* | 6/2015 | Lee | G09G 3/32 |
| 10,475,393 | B2* | 11/2019 | Lee | G09G 3/30 |
| 2015/0138258 | A1* | 5/2015 | Lee | G09G 3/3225 |
| | | | | 345/691 |
| 2020/0020271 | A1* | 1/2020 | Watsuda | G09G 3/2077 |

FOREIGN PATENT DOCUMENTS

KR 1020170132401 A 12/2017
KR 101850994 B1 4/2018

* cited by examiner

*Primary Examiner* — Sardis F Azongha
(74) *Attorney, Agent, or Firm* — Cantor Colburn LLP

(57) ABSTRACT

A display apparatus includes a display panel, a gate driver, a data driver, an emission driver and a driving controller. The display panel includes a gate line, a data line, an emission line and a pixel electrically connected to the gate line, the data line and the emission line. The gate driver outputs a gate signal to the gate line. The data driver outputs a data voltage to the data line. The emission driver outputs an emission signal to the emission line. The driving controller determines a number of emission in a single frame of the emission signal according to a luminance of a display image.

20 Claims, 14 Drawing Sheets

FIG. 12

| LUMINANCE | AID CYCLE | AOR CODE | AOR(%) | ON DUTY(%) |
|---|---|---|---|---|
| 420 | 1 | 22 | 1% | 99% |
| 412 | 1 | 22 | 1% | 99% |
| 403 | 1 | 22 | 1% | 99% |
| 395 | 1 | 32 | 2% | 98% |
| 387 | 1 | 85 | 5% | 95% |
| 380 | 4 | 121 | 8% | 92% |
| 372 | 4 | 156 | 10% | 90% |
| 365 | 4 | 201 | 13% | 87% |
| 367 | 4 | 207 | 13% | 87% |
| 350 | 4 | 207 | 13% | 87% |
| . | . | . | . | . |
| . | . | . | . | . |
| . | . | . | . | . |
| . | . | . | . | . |
| . | . | . | . | . |
| 7 | 1 | 1451 | 93% | 7% |
| 6 | 1 | 1468 | 94% | 6% |
| 5 | 1 | 1484 | 95% | 5% |
| 4 | 1 | 1499 | 96% | 4% |
| 3 | 1 | 1512 | 97% | 3% |
| 2 | 1 | 1527 | 98% | 2% |

FIG. 18

| LUMINANCE | AID CYCLE | AOR CODE | AOR(%) | ON DUTY(%) |
|---|---|---|---|---|
| 420 | 1 | 22 | 1% | 99% |
| 412 | 1 | 22 | 1% | 99% |
| 403 | 1 | 22 | 1% | 99% |
| 395 | 1 | 32 | 2% | 98% |
| 387 | 1 | 85 | 5% | 95% |
| 380 | 4 | 121 | 8% | 92% |
| 372 | 4 | 156 | 10% | 90% |
| . | . | . | . | . |
| . | . | . | . | . |
| 152 | 8 | 587 | 38% | 62% |
| 143 | 8 | 607 | 39% | 61% |
| . | . | . | . | . |
| 64 | 8 | 1012 | 65% | 35% |
| 60 | 8 | 1027 | 66% | 34% |
| . | . | . | . | . |
| 7 | 1 | 1451 | 93% | 7% |
| 6 | 1 | 1468 | 94% | 6% |
| 5 | 1 | 1484 | 95% | 5% |
| 4 | 1 | 1499 | 96% | 4% |
| 3 | 1 | 1512 | 97% | 3% |
| 2 | 1 | 1527 | 98% | 2% |

FIG. 19

| LUMINANCE | AID CYCLE | AOR CODE | AOR(%) | ON DUTY(%) |
|---|---|---|---|---|
| 420 | 1 | 22 | 1% | 99% |
| 412 | 1 | 22 | 1% | 99% |
| 403 | 1 | 22 | 1% | 99% |
| 395 | 1 | 32 | 2% | 98% |
| 387 | 1 | 85 | 5% | 95% |
| 380 | 4 | 121 | 8% | 92% |
| 372 | 4 | 156 | 10% | 90% |
| . | . | . | . | . |
| . | . | . | . | . |
| 152 | 8 | 587 | 38% | 62% |
| 143 | 8 | 607 | 39% | 61% |
| . | . | . | . | . |
| 64 | 4 | 1012 | 65% | 35% |
| 60 | 4 | 1027 | 66% | 34% |
| . | . | . | . | . |
| 7 | 1 | 1451 | 93% | 7% |
| 6 | 1 | 1468 | 94% | 6% |
| 5 | 1 | 1484 | 95% | 5% |
| 4 | 1 | 1499 | 96% | 4% |
| 3 | 1 | 1512 | 97% | 3% |
| 2 | 1 | 1527 | 98% | 2% |

DISPLAY APPARATUS AND METHOD OF DRIVING DISPLAY PANEL USING THE SAME

This application claims priority to Korean Patent Application No. 10-2019-0116809, filed on Sep. 23, 2019, and all the benefits accruing therefrom under 35 U.S.C. § 119, the content of which in its entirety is herein incorporated by reference.

BACKGROUND

1. Field

Exemplary embodiments of the invention relate to a display apparatus and a method of driving a display panel using the display apparatus. More particularly, exemplary embodiments of the invention relate to a display apparatus varying a cycle of an emission signal according to a luminance and a method of driving a display panel using the display apparatus.

2. Description of the Related Art

Generally, a display apparatus includes a display panel and a display panel driver. The display panel includes a plurality of gate lines, a plurality of data lines, a plurality of emission lines and a plurality of pixels. The display panel driver includes a gate driver, a data driver, an emission driver and a driving controller. The gate driver outputs gate signals to the plurality of gate lines. The data driver outputs data voltages to the plurality of data lines. The emission driver outputs emission signals to the plurality of emission lines. The driving controller controls the gate driver, the data driver and the emission driver.

SUMMARY

An organic light emitting element of a pixel may emit light once in a single frame, for example. However, when the organic light emitting element emits light once in a single frame, an instantaneous afterimage and a flicker may be occurred and a motion clarity may be deteriorated.

Exemplary embodiments of the invention provide a display apparatus enhancing a display quality of a display panel.

Exemplary embodiments of the invention also provide a method of driving the display panel using the display apparatus.

In an exemplary embodiment of a display apparatus according to the invention, the display apparatus includes a display panel, a gate driver, a data driver, an emission driver and a driving controller. The display panel includes a gate line, a data line, an emission line and a pixel electrically connected to the gate line, the data line and the emission line. The gate driver outputs a gate signal to the gate line. The data driver outputs a data voltage to the data line. The emission driver outputs an emission signal to the emission line. The driving controller determines a number of emission in a single frame of the emission signal according to a luminance of a display image. The number of the emission in the single frame is a first number of emission in a first luminance range of the display image. The number of the emission in the single frame is a second number of emission greater than the first number of the emission in a second luminance range of the display image having a luminance less than a luminance of the first luminance range. The number of the emission in the single frame is a third number of emission less than the second number of the emission in a third luminance range of the display image having a luminance less than the luminance of the second luminance range.

In an exemplary embodiment, the emission signal may have a first emission inactive period and a second emission inactive period in the single frame for the second luminance range of the display image. The gate signal may be activated in the first emission inactive period. The gate signal may be inactivated in the second emission inactive period.

In an exemplary embodiment, the first number of the emission may be equal to the third number of emission.

In an exemplary embodiment, the first number of the emission and the third number of emission may be one.

In an exemplary embodiment, the second number of the emission may be four.

In an exemplary embodiment, the number of the emission of the emission signal in the single frame may be a fourth number of emission greater than the second number of the emission in a fourth luminance range of the display image having a luminance less than the luminance of the second luminance range and greater than the luminance of the third luminance range.

In an exemplary embodiment, the first number of the emission and the third number of the emission may be one.

In an exemplary embodiment, the second number of the emission may be four. The fourth number of the emission may be eight.

In an exemplary embodiment, the number of the emission of the emission signal in the single frame may be a fifth number of emission less than the fourth number of the emission and greater than the third number of the emission in a fifth luminance range of the display image having a luminance less than the luminance of the fourth luminance range and greater than the luminance of the third luminance range.

In an exemplary embodiment, the first number of the emission and the third number of the emission may be one.

In an exemplary embodiment, the second number of the emission may be four. The fourth number of the emission may be eight. The fifth number of the emission may be four.

In an exemplary embodiment, the display apparatus may further include a plurality of gate lines such that, when AOR CODE representing a number of inactive gate lines among the plurality of gate lines is N for a maximum luminance of the display image, the second luminance range may start at a luminance having the AOR CODE equal to or greater than 4N.

In an exemplary embodiment, the luminance of the display image may be determined by a user luminance setting which is set by a user.

In an exemplary embodiment, the luminance of the display image may be determined by input image data.

In an exemplary embodiment of a method of driving a display panel, the method includes determining a number of emission in a single frame of the emission signal according to a luminance of a display image, outputting a gate signal to a gate line of the display panel, outputting a data voltage to a data line of the display panel and outputting an emission signal to an emission line of the display panel. The number of the emission in the single frame may be a first number of emission in a first luminance range of the display image. The number of the emission in the single frame may be a second number of emission greater than the first number of the emission in a second luminance range of the display image having a luminance less than a luminance of the first luminance range. The number of the emission in the single frame may be a third number of emission less than the second number of the emission in a third luminance range of the display image having a luminance less than the luminance of the second luminance range.

In an exemplary embodiment, the emission signal may have a first emission inactive period and a second emission inactive period in the single frame for the second luminance range of the display image. The gate signal may be activated in the first emission inactive period. The gate signal may be inactivated in the second emission inactive period.

In an exemplary embodiment, the first number of the emission may be equal to the third number of the emission.

In an exemplary embodiment, the number of the emission of the emission signal in the single frame may be a fourth number of emission greater than the second number of the emission in a fourth luminance range of the display image having a luminance less than the luminance of the second luminance range and greater than the luminance of the third luminance range.

In an exemplary embodiment, the number of the emission of the emission signal in the single frame may be a fifth number of emission less than the fourth number of the emission and greater than the third number of the emission in a fifth luminance range of the display image having a luminance less than the luminance of the fourth luminance range and greater than the luminance of the third luminance range.

In an exemplary embodiment, when AOR CODE representing a number of inactive gate lines among a plurality of gate lines is N for a maximum luminance of the display image, the second luminance range may start at a luminance having the AOR CODE equal to or greater than 4N.

According to the display apparatus and the method of driving the display panel, the number of the emission of the emission signal in a single frame varies according to a luminance of the display image. The pixel may emit the light in plural times in the single frame for a middle luminance range so that the instantaneous afterimage and the flicker may be prevented and the motion clarity may be enhanced. In addition, the pixel may emit the light in a single time in the single frame for an extremely low luminance range so that a color blurring may be prevented. Therefore, the display quality of the display panel may be enhanced.

BRIEF DESCRIPTION OF THE DRAWINGS

The above and other features and advantages of the invention will become more apparent by describing in detailed exemplary embodiments thereof with reference to the accompanying drawings, in which:

FIG. 12 is a table representing the number of emission, AOR CODE, AOR and ON DUTY determined by a driving controller of FIG. 1 according to the luminance of a display image;

FIG. 18 is a table representing an exemplary embodiment of the number of emission, AOR CODE, AOR and ON DUTY determined by a driving controller of a display apparatus according to the luminance of a display image according to the invention; and FIG. 19 is a table representing an exemplary embodiment of the number of emission, AOR CODE, AOR and ON DUTY determined by a driving controller of a display apparatus according to the luminance of a display image according to the invention.

DETAILED DESCRIPTION

Figure 1:
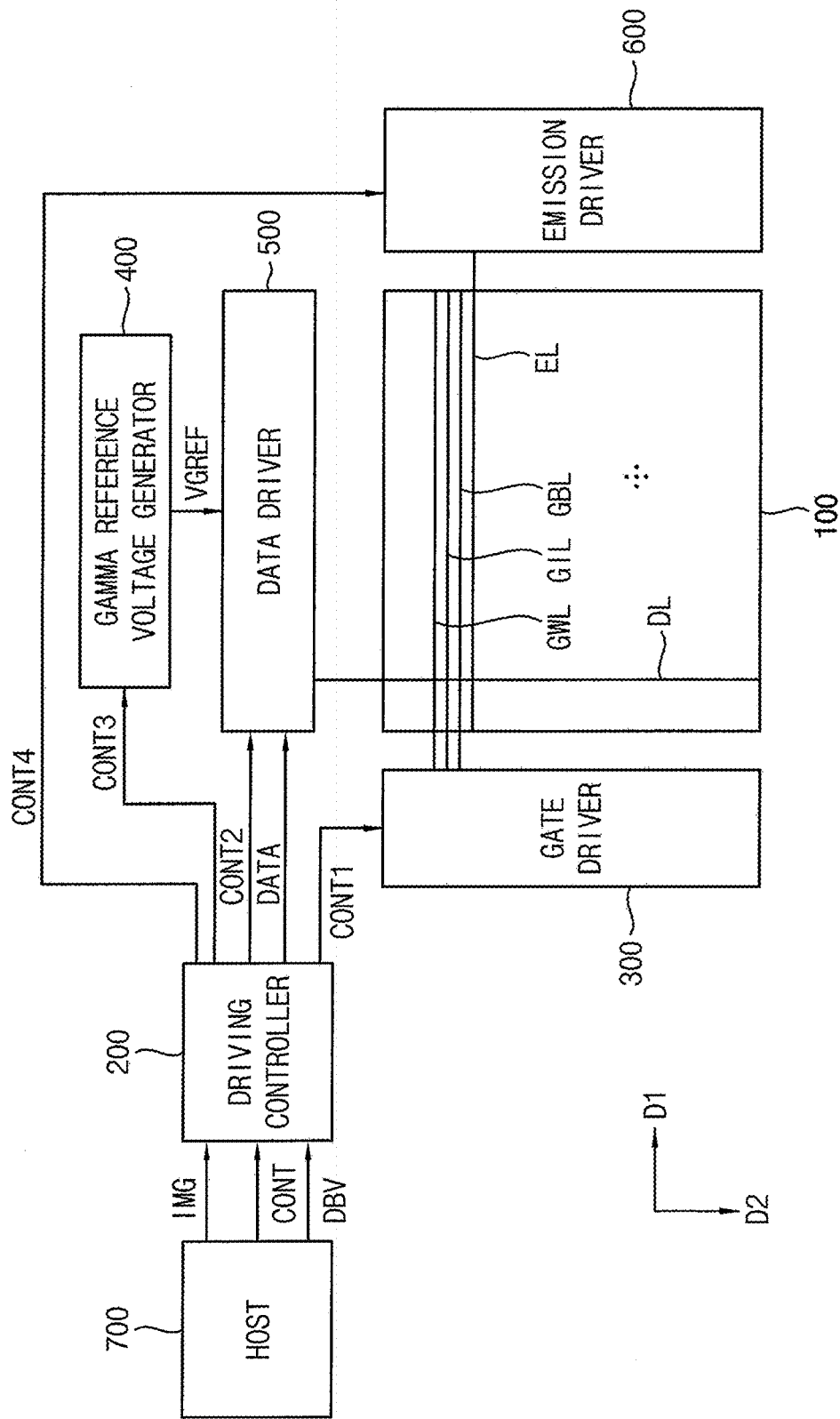
FIG. 1 is a block diagram illustrating an exemplary embodiment of a display apparatus according to the invention.

Hereinafter, the invention will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a block diagram illustrating an exemplary embodiment of a display apparatus according to the invention.

Referring to FIG. 1, the display apparatus includes a display panel 100 and a display panel driver. The display panel driver includes a driving controller 200, a gate driver 300, a gamma reference voltage generator 400, a data driver 500 and an emission driver 600.

The display panel 100 has a display region on which an image is displayed and a peripheral region adjacent to the display region.

The display panel 100 includes a plurality of gate lines GWL, GIL and GBL, a plurality of data lines DL, a plurality of emission lines EL and a plurality of pixels electrically connected to the gate lines GWL, GIL and GBL, the data lines DL and the emission lines EL. The gate lines GWL, GIL and GBL extend in a first direction D1, the data lines DL extend in a second direction D2 crossing the first direction D1 and the emission lines EL extend in the first direction D1.

The driving controller 200 receives input image data IMG and an input control signal CONT from a host 700. In an exemplary embodiment, the input image data IMG may include red image data, green image data and blue image data, for example. The input image data IMG may include white image data. The input image data IMG may include magenta image data, cyan image data and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals driving the gate lines GWL, GIL and GBL in response to the first control signal CONT1 received from the driving controller 200. The gate driver 300 may sequentially output the gate signals to the gate lines GWL, GIL and GBL. In an exemplary embodiment, the gate driver 300 may be integrated on the display panel 100, for example. In an exemplary embodiment, the gate driver 300 may be disposed (e.g., mounted) on the display panel 100, for example.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an exemplary embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The emission driver 600 generates emission signals to drive the emission lines EL in response to the fourth control signal CONT4 received from the driving controller 200. The emission driver 600 may output the emission signals to the emission lines EL.

Figure 2:
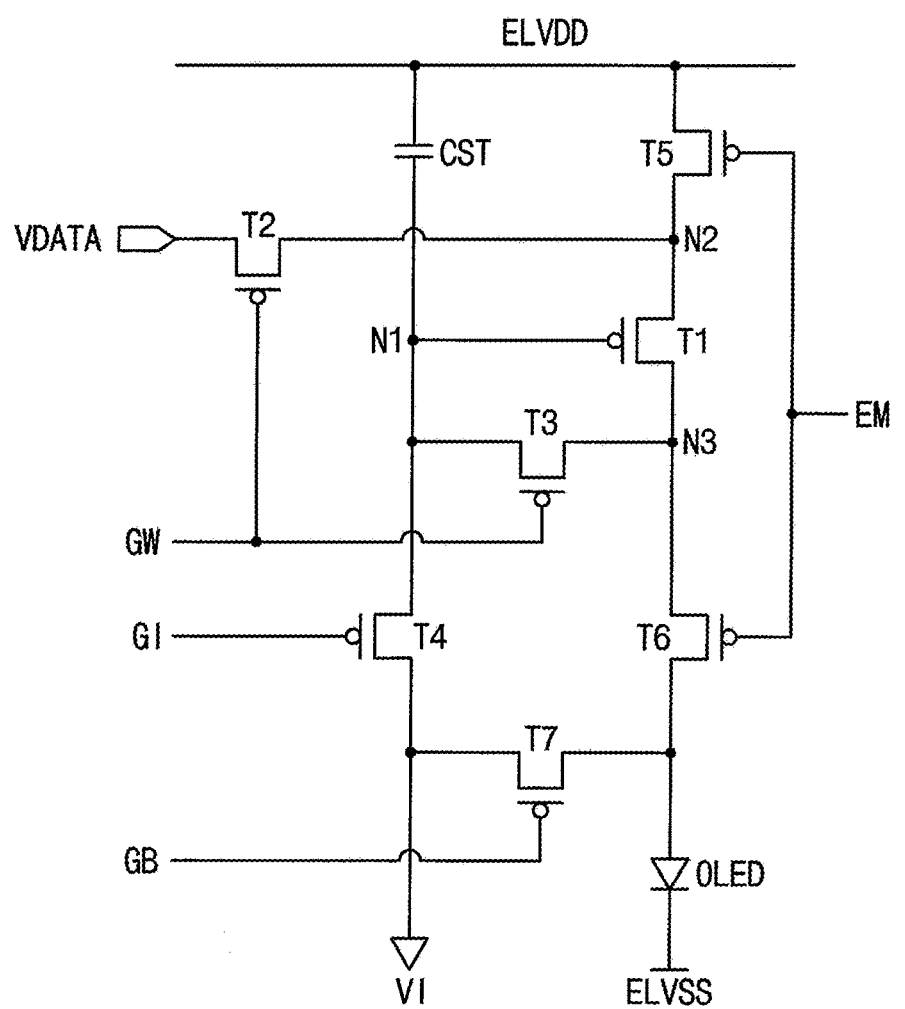
FIG. 2 is a circuit diagram illustrating a pixel of a display panel of FIG. 1.
Figure 3:
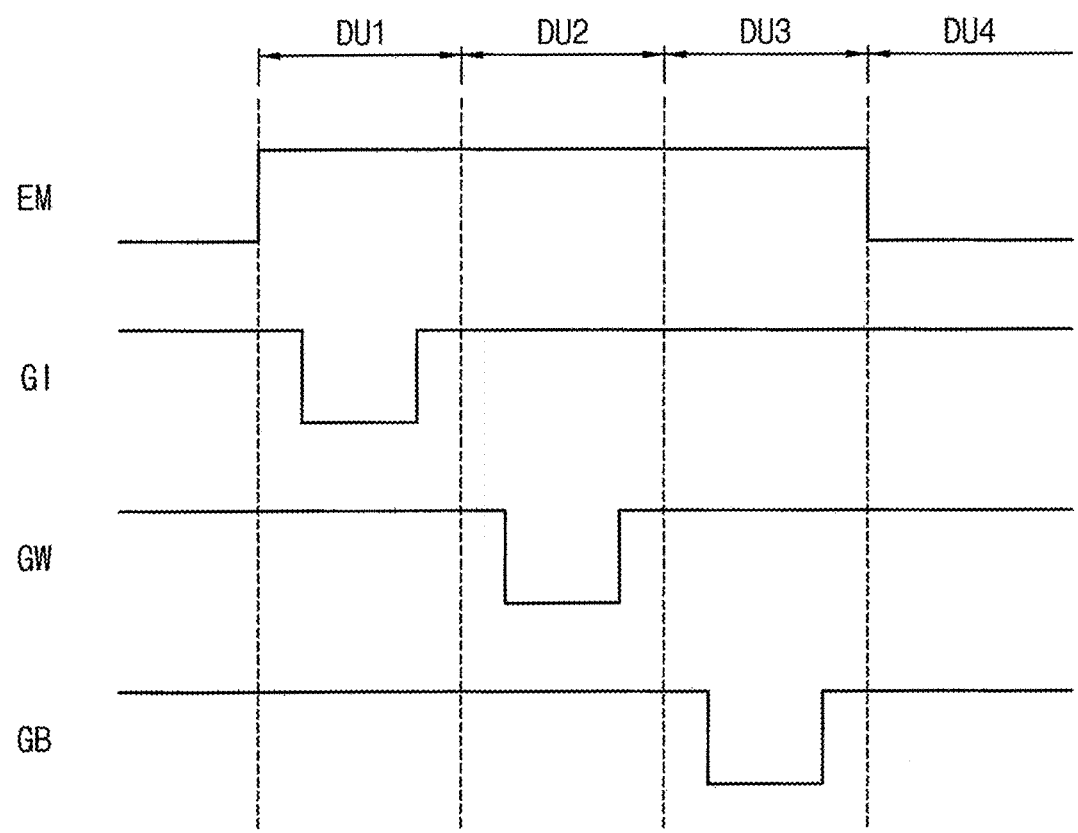
FIG. 3 is a timing diagram illustrating exemplary input signals applied to the pixel of FIG. 2.

FIG. 2 is a circuit diagram illustrating a pixel of the display panel 100 of FIG. 1. FIG. 3 is a timing diagram illustrating input signals applied to the pixel of FIG. 2.

Referring to FIGS. 1 to 3, the display panel 100 includes the plurality of the pixels. Each pixel includes an organic light emitting element OLED.

The pixels receive a data write gate signal GW, a data initialization gate signal GI, an organic light emitting element initialization gate signal GB, the data voltage VDATA and the emission signal EM and the organic light emitting elements OLED of the pixels emit light corresponding to the level of the data voltage VDATA to display the image.

At least one of the pixels may include first to seventh pixel switching elements T1 to T7, a storage capacitor CST and the organic light emitting element OLED.

The first pixel switching element T1 includes a control electrode connected to a first node N1, an input electrode connected to a second node N2 and an output electrode connected to a third node N3.

In an exemplary embodiment, the first pixel switching element T1 may be a P-type thin film transistor, for example. The control electrode of the first pixel switching element T1 may be a gate electrode, the input electrode of the first pixel switching element T1 may be a source electrode and the output electrode of the first pixel switching element T1 may be a drain electrode.

The second pixel switching element T2 includes a control electrode to which the data write gate signal GW is applied, an input electrode to which the data voltage VDATA is applied and an output electrode connected to the second node N2.

In an exemplary embodiment, the second pixel switching element T2 may be a P-type thin film transistor, for example. The control electrode of the second pixel switching element T2 may be a gate electrode, the input electrode of the second pixel switching element T2 may be a source electrode and the output electrode of the second pixel switching element T2 may be a drain electrode.

The third pixel switching element T3 includes a control electrode to which the data write gate signal GW is applied, an input electrode connected to the first node N1 and an output electrode connected to the third node N3.

In an exemplary embodiment, the third pixel switching element T3 may be a P-type thin film transistor, for example. The control electrode of the third pixel switching element T3 may be a gate electrode, the input electrode of the third pixel switching element T3 may be a source electrode and the output electrode of the third pixel switching element T3 may be a drain electrode.

The fourth pixel switching element T4 includes a control electrode to which the data initialization gate signal GI is applied, an input electrode to which an initialization voltage VI is applied and an output electrode connected to the first node N1.

In an exemplary embodiment, the fourth pixel switching element T4 may be a P-type thin film transistor, for example. The control electrode of the fourth pixel switching element T4 may be a gate electrode, the input electrode of the fourth pixel switching element T4 may be a source electrode and the output electrode of the fourth pixel switching element T4 may be a drain electrode.

The fifth pixel switching element T5 includes a control electrode to which the emission signal EM is applied, an input electrode to which a high power voltage ELVDD is applied and an output electrode connected to the second node N2.

In an exemplary embodiment, the fifth pixel switching element T5 may be a P-type thin film transistor, for example. The control electrode of the fifth pixel switching element T5 may be a gate electrode, the input electrode of the fifth pixel switching element T5 may be a source electrode and the output electrode of the fifth pixel switching element T5 may be a drain electrode.

The sixth pixel switching element T6 includes a control electrode to which the emission signal EM is applied, an input electrode connected to the third node N3 and an output electrode connected to an anode electrode of the organic light emitting element OLED.

In an exemplary embodiment, the sixth pixel switching element T6 may be a P-type thin film transistor, for example. The control electrode of the sixth pixel switching element T6 may be a gate electrode, the input electrode of the sixth pixel switching element T6 may be a source electrode and the output electrode of the sixth pixel switching element T6 may be a drain electrode.

The seventh pixel switching element T7 includes a control electrode to which the organic light emitting element initialization gate signal GB is applied, an input electrode to which the initialization voltage VI is applied and an output electrode connected to the anode electrode of the organic light emitting element OLED.

In an exemplary embodiment, the seventh pixel switching element T7 may be a P-type thin film transistor, for example. The control electrode of the seventh pixel switching element T7 may be a gate electrode, the input electrode of the seventh pixel switching element T7 may be a source electrode and the output electrode of the seventh pixel switching element T7 may be a drain electrode.

The storage capacitor CST includes a first electrode to which the high power voltage ELVDD is applied and a second electrode connected to the first node N1.

The organic light emitting element OLED includes a cathode electrode to which a low power voltage ELVSS is applied and the anode electrode.

In FIG. 3, during a first duration DU1, the first node N1 and the storage capacitor CST are initialized in response to the data initialization gate signal GI. During a second duration DU2, a threshold voltage |VTH| of the first pixel switching element T1 is compensated and the data voltage VDATA of which the threshold voltage |VTH| is compensated is written to the first node N1 in response to the data write gate signal GW. During a third duration DU3, the anode electrode of the organic light emitting element OLED is initialized in response to the organic light emitting element initialization gate signal GB. During a fourth duration DU4, the organic light emitting element OLED emits the light in response to the emission signal EM so that the display panel 100 displays the image.

During the first duration DU1, the data initialization gate signal GI may have an active level. In an exemplary embodiment, the active level of the data initialization gate signal GI may be a low level, for example. When the data initialization gate signal GI has the active level, the fourth pixel switching element T4 is turned on so that the initialization voltage VI may be applied to the first node N1. The data initialization gate signal GI of a present stage may be a scan signal of a previous stage.

During the second duration DU2, the data write gate signal GW may have an active level. In an exemplary embodiment, the active level of the data write gate signal GW may be a low level, for example. When the data write gate signal GW has the active level, the second pixel switching element T2 and the third pixel switching element T3 are turned on. In addition, the first pixel switching element T1 is turned on in response to the initialization voltage VI. The data write gate signal GW of the present stage may be a scan signal of the present stage.

A voltage which is subtraction an absolute value |VTH| of the threshold voltage of the first pixel switching element T1 from the data voltage VDATA may be charged at the first node N1 along a path generated by the first to third pixel switching elements T1, T2 and T3.

During the third duration DU3, the organic light emitting element initialization gate signal GB may have an active level. In an exemplary embodiment, the active level of the organic light emitting element initialization gate signal GB may be a low level, for example. When the organic light emitting element initialization gate signal GB has the active level, the seventh pixel switching element T7 is turned on so that the initialization voltage VI may be applied to the anode electrode of the organic light emitting element OLED. The organic light emitting element initialization gate signal GB of the present stage may be a scan signal of a next stage.

During the fourth duration DU4, the emission signal EM may have an active level. The active level of the emission signal EM may be a low level. When the emission signal EM has the active level, the fifth pixel switching element T5 and the sixth pixel switching element T6 are turned on. In addition, the first pixel switching element T1 is turned on by the data voltage VDATA.

A driving current flows through the fifth pixel switching element T5, the first pixel switching element T1 and the sixth pixel switching element T6 to drive the organic light emitting element OLED. An intensity of the driving current may be determined by the level of the data voltage VDATA. A luminance of the organic light emitting element OLED is determined by the intensity of the driving current. The driving current ISD flowing through a path from the input electrode to the output electrode of the first pixel switching element T1 is determined as following Equation 1.

$$ISD = \frac{1}{2}\mu Cox\frac{W}{L}(VSG - |VTH|)^2 \quad \text{[Equation 1]}$$

In Equation 1, μ denotes a mobility of the first pixel switching element T1. Cox denotes a capacitance per unit area of the first pixel switching element T1. W/L denotes a width to length ratio of the first pixel switching element T1. VSG denotes a voltage between the input electrode N2 of the first pixel switching element T1 and the control node N1 of the first pixel switching element T1. |VTH| denotes the threshold voltage of the first pixel switching element T1.

The voltage VG of the first node N1 after the compensation of the threshold voltage |VTH| during the second duration DU2 may be represented as following Equation 2.

$$VG = VDATA - |VTH| \quad \text{[Equation 2]}$$

When the organic light emitting element OLED emits the light during the fourth duration DU4, the driving voltage VOV and the driving current ISD may be represented as following Equations 3 and 4. In Equation 3, VS denotes a voltage of the second node N2.

$$VOV = VS - VG - |VTH| = \quad \text{[Equation 3]}$$
$$ELVDD - (VDATA - |VTH|) - |VTH| =$$
$$ELVDD - VDATA$$

$$ISD = \frac{1}{2}\mu Cox\frac{W}{L}(ELVDD - VDATA)^2 \quad \text{[Equation 4]}$$

The threshold voltage |VTH| is compensated during the second duration DU2, so that the driving current ISD may be determined regardless of the threshold voltage |VTH| of the first pixel switching element T1 when the organic light emitting element OLED emits the light during the fourth duration DU4.

Figure 4:
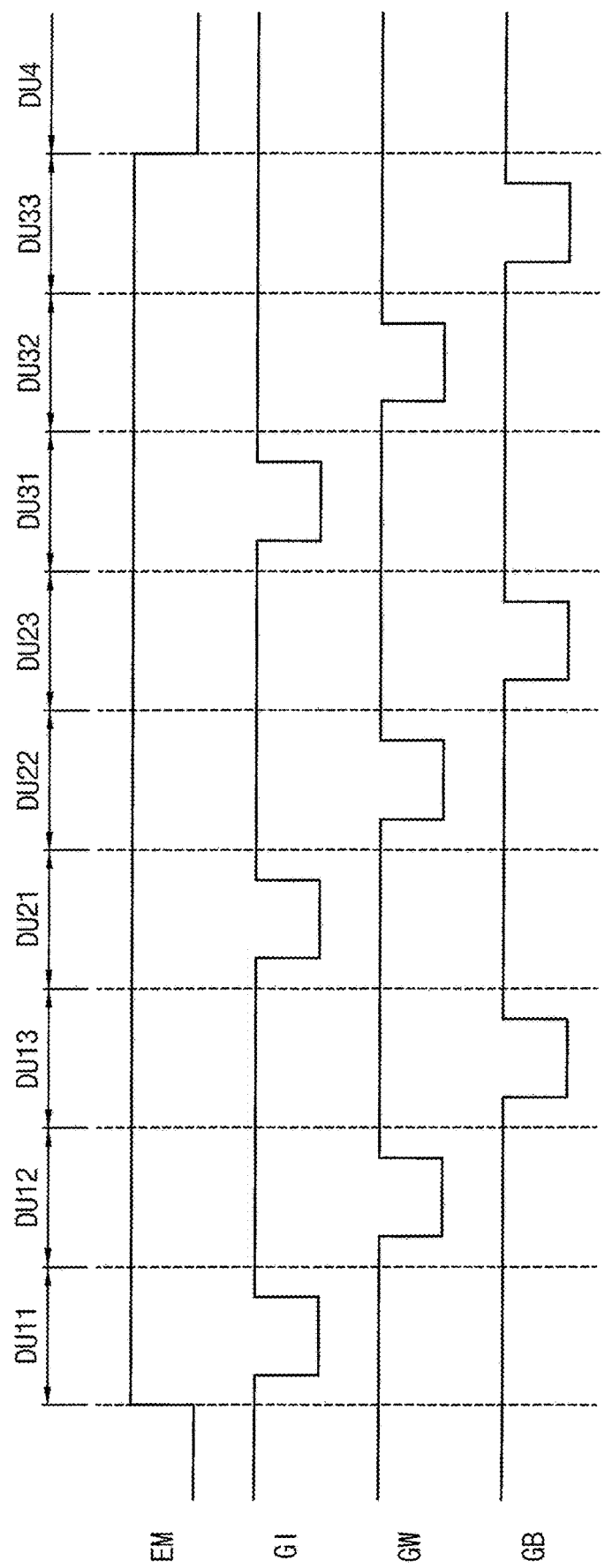
FIG. 4 is a timing diagram illustrating exemplary input signals applied to the pixel of FIG. 2.

FIG. 4 is a timing diagram illustrating exemplary input signals applied to the pixel of FIG. 2.

The input signals applied to the pixel of the display apparatus and the method of driving the display panel according to the illustrated exemplary embodiment is substantially the same as the input signals applied to the pixel of the display apparatus and the method of driving the display panel of FIG. 3 except that the data writing operation is repeated for three times. Thus, the same reference numerals will be used to refer to the same or like parts as those described in the previous exemplary embodiment of FIGS. 1 to 3 and any repetitive explanation concerning the above elements will be omitted.

Referring to FIGS. 1, 2 and 4, during a 1-1 duration DU11, the first node N1 and the storage capacitor CST are initialized in response to the data initialization gate signal GI. During a 1-2 duration DU12, the threshold voltage |VTH| of the first pixel switching element T1 is compensated and the data voltage VDATA of which the threshold voltage |VTH| is compensated is written to the first node N1 in response to the data write gate signal GW. During a 1-3 duration DU13, the anode electrode of the organic light emitting element OLED is initialized in response to the organic light emitting element initialization gate signal GB.

During a 2-1 duration DU21, the first node N1 and the storage capacitor CST are initialized in response to the data initialization gate signal G1. During a 2-2 duration DU22, the threshold voltage |VTH| of the first pixel switching element T1 is compensated and the data voltage VDATA of which the threshold voltage |VTH| is compensated is written to the first node N1 in response to the data write gate signal GW. During a 2-3 duration DU23, the anode electrode of the organic light emitting element OLED is initialized in response to the organic light emitting element initialization gate signal GB.

During a 3-1 duration DU31, the first node N1 and the storage capacitor CST are initialized in response to the data initialization gate signal G1. During a 3-2 duration DU32, the threshold voltage |VTH| of the first pixel switching element T1 is compensated and the data voltage VDATA of which the threshold voltage |VTH| is compensated is written to the first node N1 in response to the data write gate signal GW. During a 3-3 duration DU33, the anode electrode of the organic light emitting element OLED is initialized in response to the organic light emitting element initialization gate signal GB.

During a fourth duration DU4, the organic light emitting element OLED emits the light in response to the emission signal EM so that the display panel 100 displays the image.

In the illustrated exemplary embodiment, the data voltage VDATA is repeatedly written for three times so that the level of the data voltage VDATA may be more stable so that the driving reliability and the display quality may be enhanced.

Figure 5:
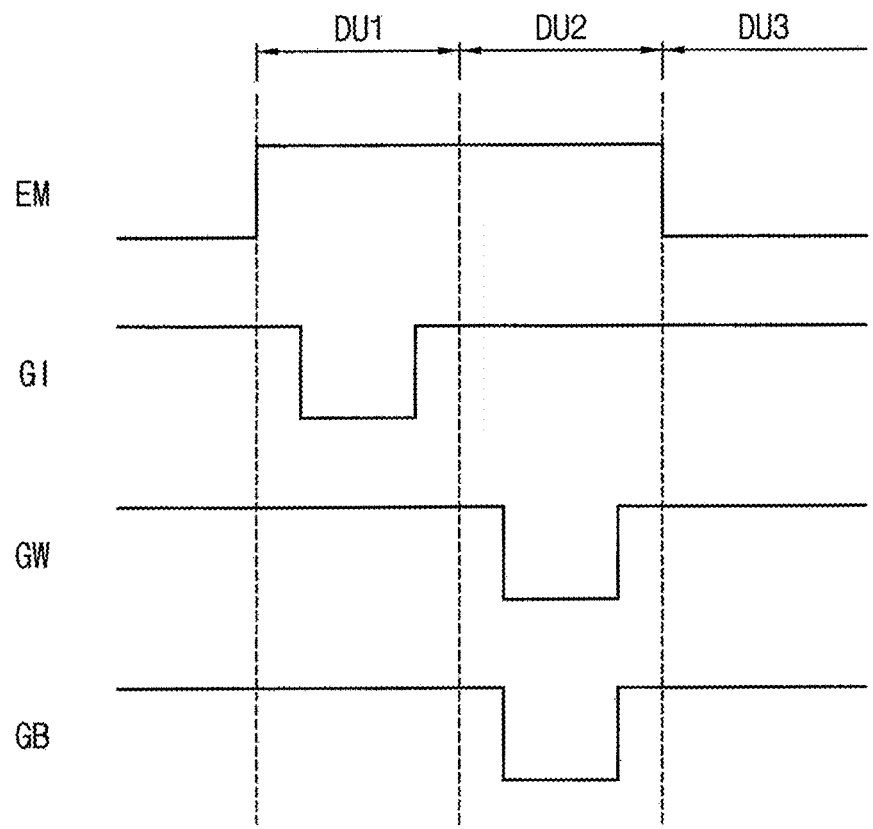
FIG. 5 is a timing diagram illustrating exemplary input signals applied to the pixel of FIG. 2.

FIG. 5 is a timing diagram illustrating exemplary input signals applied to the pixel of FIG. 2.

The input signals applied to the pixel of the display apparatus and the method of driving the display panel according to the illustrated exemplary embodiment is substantially the same as the input signals applied to the pixel of the display apparatus and the method of driving the display panel of FIG. 3 except that the active period of the organic light emitting element initialization gate signal GB is same as the active period of the data write gate signal GW. Thus, the same reference numerals will be used to refer to the same or like parts as those described in the previous exemplary embodiment of FIGS. 1 to 3 and any repetitive explanation concerning the above elements will be omitted.

During a first duration DU1, the first node N1 and the storage capacitor CST are initialized in response to the data initialization gate signal G1. During a second duration DU2, a threshold voltage |VTH| of the first pixel switching element T1 is compensated and the data voltage VDATA of which the threshold voltage |VTH| is compensated is written to the first node N1 in response to the data write gate signal GW. In addition, during the second duration DU2, the anode electrode of the organic light emitting element OLED is initialized in response to the organic light emitting element initialization gate signal GB. During a third duration DU3, the organic light emitting element OLED emits the light in response to the emission signal EM so that the display panel 100 displays the image.

In the illustrated exemplary embodiment, the active period of the organic light emitting element initialization gate signal GB may be same as the active period of the data write gate signal GW. In an exemplary embodiment, the control electrode of the seventh pixel switching element T7 may be connected to the control electrode of the second pixel switching element T2, for example.

Figure 6:
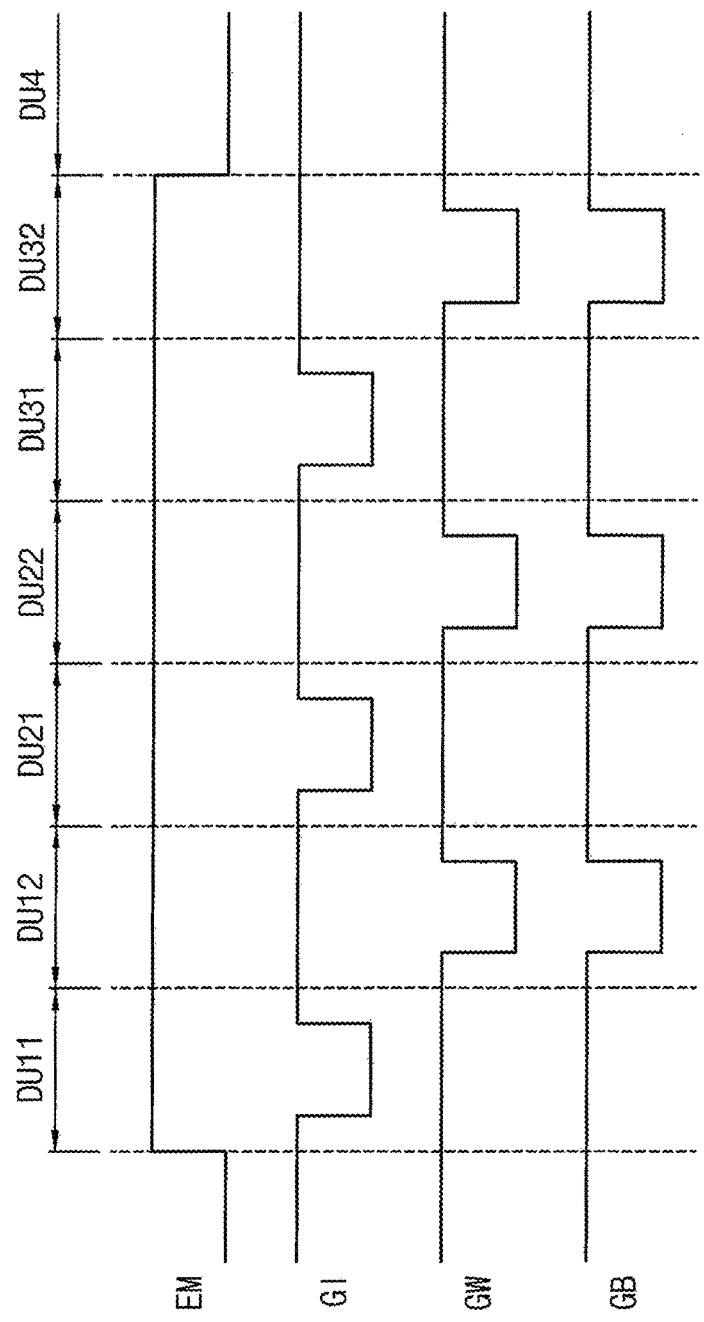
FIG. 6 is a timing diagram illustrating exemplary input signals applied to the pixel of FIG. 2.

FIG. 6 is a timing diagram illustrating exemplary input signals applied to the pixel of FIG. 2.

The input signals applied to the pixel of the display apparatus and the method of driving the display panel according to the illustrated exemplary embodiment is substantially the same as the input signals applied to the pixel of the display apparatus and the method of driving the display panel of FIG. 5 except that the data writing operation is repeated for three times. Thus, the same reference numerals will be used to refer to the same or like parts as those described in the previous exemplary embodiment of FIGS. 1, 2 and 5 and any repetitive explanation concerning the above elements will be omitted.

Referring to FIGS. 1, 2 and 6, during a 1-1 duration DU11, the first node N1 and the storage capacitor CST are initialized in response to the data initialization gate signal G1. During a 1-2 duration DU12, the threshold voltage |VTH| of the first pixel switching element T1 is compensated and the data voltage VDATA of which the threshold voltage |VTH| is compensated is written to the first node N1 in response to the data write gate signal GW. In addition, during a 1-2 duration DU12, the anode electrode of the organic light emitting element OLED is initialized in response to the organic light emitting element initialization gate signal GB.

During 2-1 and 3-1 durations DU21 and DU31, the first node N1 and the storage capacitor CST are initialized in response to the data initialization gate signal G1. During 2-2 and 3-2 durations DU22 and DU32, the threshold voltage |VTH| of the first pixel switching element T1 is compensated and the data voltage VDATA of which the threshold voltage |VTH| is compensated is written to the first node N1 in response to the data write gate signal GW. In addition, during 2-2 and 3-2 durations DU22 and DU32, the anode electrode of the organic light emitting element OLED is initialized in response to the organic light emitting element initialization gate signal GB.

During a fourth duration DU4, the organic light emitting element OLED emits the light in response to the emission signal EM so that the display panel 100 displays the image.

In the illustrated exemplary embodiment, the data voltage VDATA is repeatedly written for three times so that the level of the data voltage VDATA may be more stable so that the driving reliability and the display quality may be enhanced.

Figure 7:
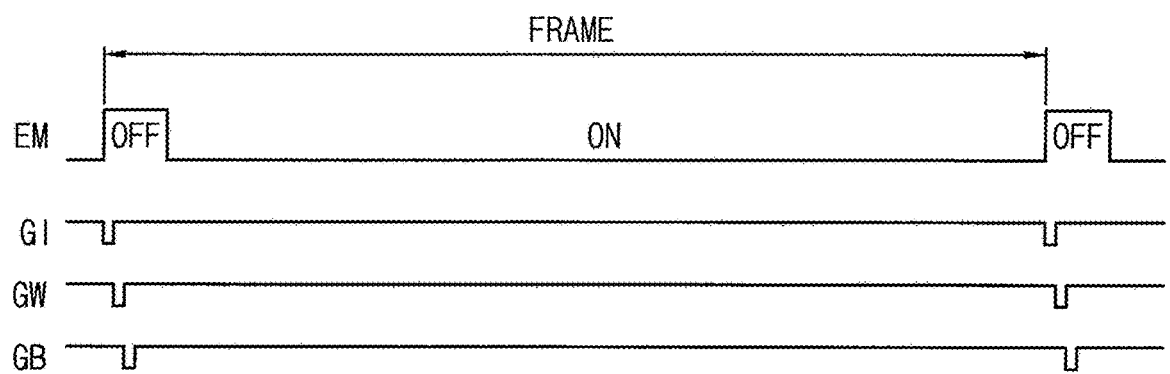
FIG. 7 is a timing diagram illustrating exemplary input signals applied to the pixel of FIG. 2 when the number of emission is one in a single frame and a display image represents a high luminance.
Figure 8:
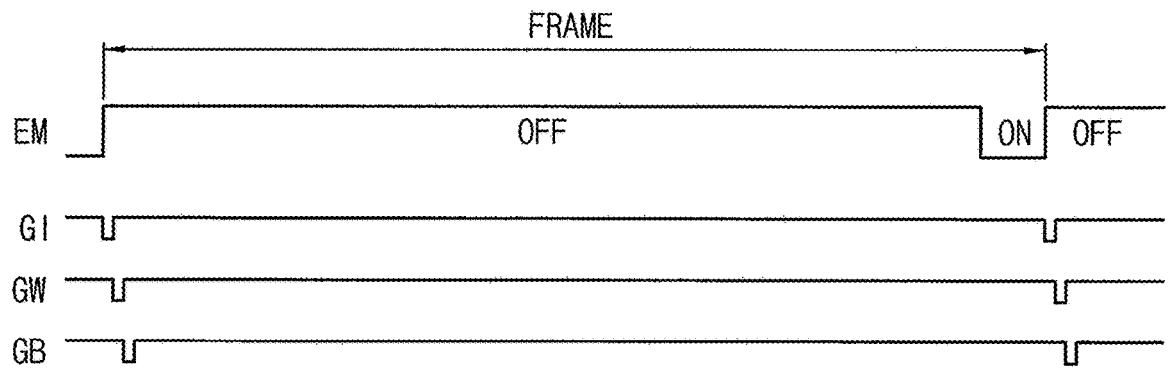
FIG. 8 is a timing diagram illustrating exemplary input signals applied to the pixel of FIG. 2 when the number of emission is one in the single frame and a display image represents a low luminance.

FIG. 7 is a timing diagram illustrating exemplary input signals applied to the pixel of FIG. 2 when the number of emission is one in a single frame FRAME and a display image represents a high luminance. FIG. 8 is a timing diagram illustrating exemplary input signals applied to the pixel of FIG. 2 when the number of emission is one in the single frame FRAME and a display image represents a low luminance.

Referring to FIGS. 1 to 8, the driving controller 200 may determine the number of emission in the single frame FRAME of the emission signal EM according to the luminance of the display image. In FIGS. 7 and 8, the number of emission in the single frame FRAME may be one. For convenience of explanation, the data write gate signal GW, the data initialization gate signal G1 and the organic light emitting element initialization gate signal GB may have the waveforms shown in FIG. 3. However, the invention may not be limited thereto. In an alternative exemplary embodiment, the data initialization gate signal G1 and the organic light emitting element initialization gate signal GB may have the waveforms shown in FIGS. 4, 5 and 6.

The display panel 100 may display an output grayscale value of the display image based on the data voltage VDATA and an active period ON of the emission signal EM. When the data voltage VDATA increases, the output grayscale value of the display image may increase. In addition, when the active period ON of the emission signal EM increases, the output grayscale value of the display image may increase.

The active period ON of the emission signal EM may be set to be longer than an inactive period OFF of the emission signal EM to represent a high luminance as shown in FIG. 7. In contrast, the inactive period OFF of the emission signal EM may be set to be longer than the inactive period ON of the emission signal EM to represent a low luminance as shown in FIG. 8.

Figure 9:
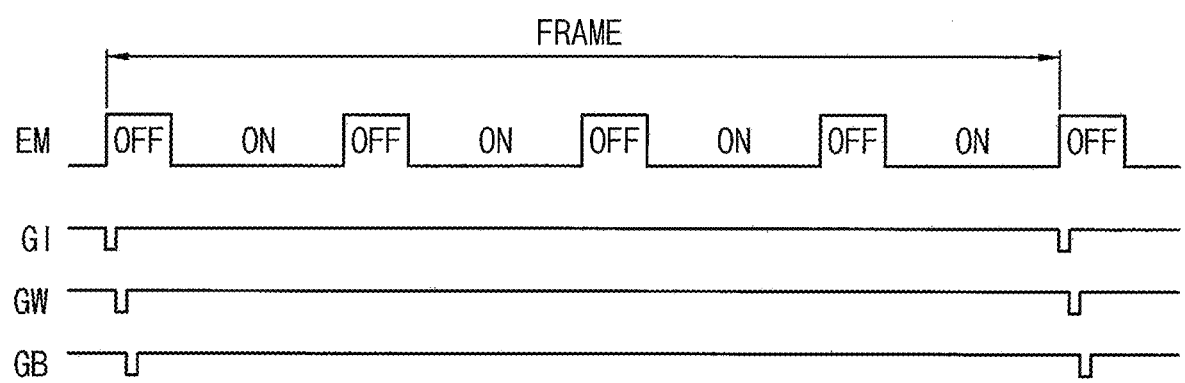
FIG. 9 is a timing diagram illustrating exemplary input signals applied to the pixel of FIG. 2 when the number of emission is four in the single frame and a display image represents a high luminance.
Figure 10:
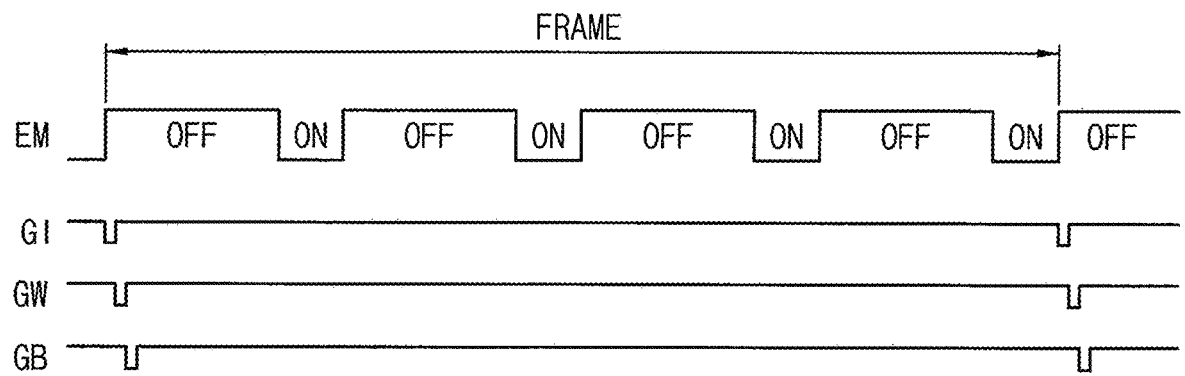
FIG. 10 is a timing diagram illustrating exemplary input signals applied to the pixel of FIG. 2 when the number of emission is four in the single frame and a display image represents a low luminance.

FIG. 9 is a timing diagram illustrating exemplary input signals applied to the pixel of FIG. 2 when the number of emission is four in the single frame FRAME and a display image represents a high luminance. FIG. 10 is a timing diagram illustrating exemplary input signals applied to the pixel of FIG. 2 when the number of emission is four in the single frame FRAME and a display image represents a low luminance.

Referring to FIGS. 1 to 10, the driving controller 200 may determine the number of emission in the single frame FRAME of the emission signal EM according to the luminance of the display image. In FIGS. 9 and 10, the number of emission in the single frame FRAME may be four.

The active period ON of the emission signal EM may be set to be longer than an inactive period OFF of the emission signal EM to represent a high luminance as shown in FIG. 9. In contrast, the inactive period OFF of the emission signal EM may be set to be longer than the inactive period ON of the emission signal EM to represent a low luminance as shown in FIG. 10.

Figure 11:
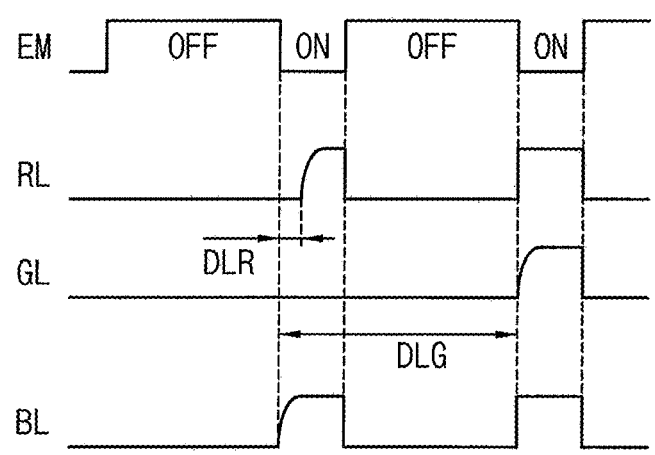
FIG. 11 is a timing diagram illustrating a luminance of the pixel of FIG. 2 when the number of emission is four in the single frame and a display image represents an extremely low luminance.

FIG. 11 is a timing diagram illustrating a luminance of the pixel of FIG. 2 when the number of emission is four in the single frame FRAME and a display image represents an extremely low luminance.

Referring to FIGS. 1 to 11, when the display image represents the extremely low luminance, the active period ON of the emission signal EM may be set to be extremely short. In an exemplary embodiment, the display panel 100 may include a red organic light emitting element RL, a green organic light emitting element GL and a blue organic light emitting element BL, for example. A response speed of the red organic light emitting element RL, a response speed of the green organic light emitting element GL and a response speed of the blue organic light emitting element BL may vary. When the active period ON of the emission signal EM is extremely short, the color blurring may be generated due to the difference of the response speeds of the red, green and blue organic light emitting elements RL, GL and BL.

In an exemplary embodiment, the response speed of the blue organic light emitting element BL is fast so that the blue organic light emitting element BL may immediately emit light in a first emission active period, for example. The response speed of the red organic light emitting element RL is slower than the response speed of the blue organic light emitting element BL so that the red organic light emitting element RL may emit light in the first active period after a first delay time DLR from a start of the first emission active period. The response speed of the green organic light emitting element GL is slower than the response speed of the red organic light emitting element RL so that the green organic light emitting element GL may emit light in a second active period after a second delay time DLG from a start of the first emission active period. The different turn on times of the red, green and blue organic light emitting elements RL, GL and BL may generate the color blurring.

Figure 13:
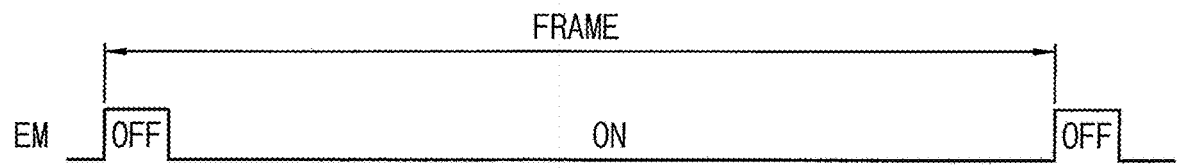
FIG. 13 is a timing diagram illustrating an emission signal applied to the pixel of FIG. 2 when the luminance of the display image is 420 nit in FIG. 12.
Figure 14:
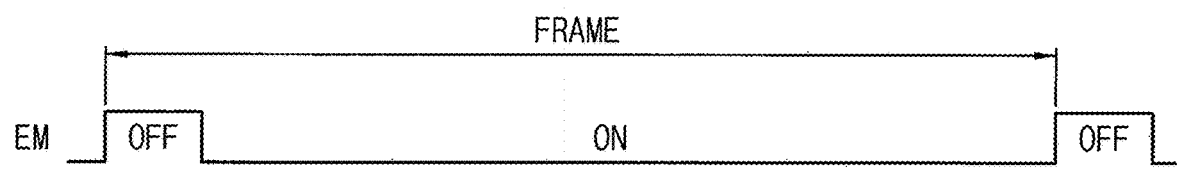
FIG. 14 is a timing diagram illustrating an emission signal applied to the pixel of FIG. 2 when the luminance of the display image is 395 nit in FIG. 12.
Figure 15:
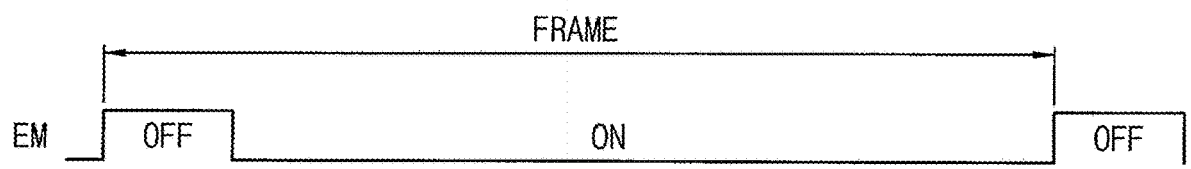
FIG. 15 is a timing diagram illustrating an emission signal applied to the pixel of FIG. 2 when the luminance of the display image is 387 nit in FIG. 12.
Figure 16:
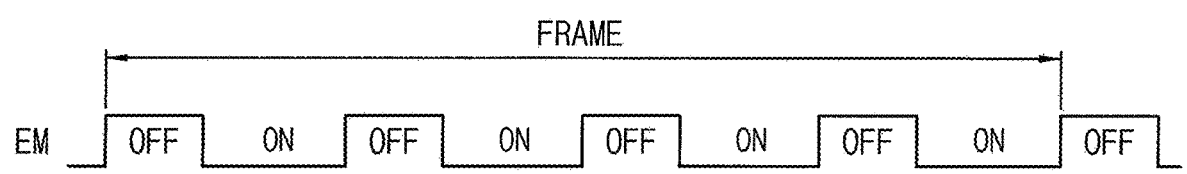
FIG. 16 is a timing diagram illustrating an emission signal applied to the pixel of FIG. 2 when the luminance of the display image is 372 nit in FIG. 12.
Figure 17:
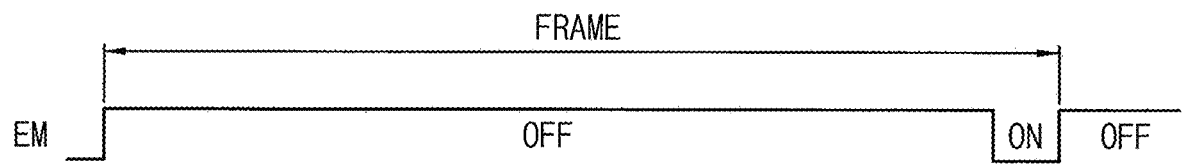
FIG. 17 is a timing diagram illustrating an emission signal applied to the pixel of FIG. 2 when the luminance of the display image is 2 nit in FIG. 12.

FIG. 12 is a table representing the number of emission, AOR CODE, AOR and ON DUTY determined by a driving controller of FIG. 1 according to the luminance of a display image. FIG. 13 is a timing diagram illustrating an emission signal applied to the pixel of FIG. 2 when the luminance of the display image is 420 nit in FIG. 12. FIG. 14 is a timing diagram illustrating an emission signal applied to the pixel of FIG. 2 when the luminance of the display image is 395 nit in FIG. 12. FIG. 15 is a timing diagram illustrating an emission signal applied to the pixel of FIG. 2 when the luminance of the display image is 387 nit in FIG. 12. FIG. 16 is a timing diagram illustrating an emission signal applied to the pixel of FIG. 2 when the luminance of the display image is 372 nit in FIG. 12. FIG. 17 is a timing diagram illustrating an emission signal applied to the pixel of FIG. 2 when the luminance of the display image is 2 nit in FIG. 12.

Referring to FIGS. 1 to 17, the table in FIG. 12 includes a column of "LUMINANCE" representing the luminance of the display image, a column of "AID CYCLE" representing the number of emission in the single frame FRAME, a column of "AOR CODE" representing the number of inactive gate lines among all gate lines, a column of "AOR" representing a ratio of the number of the inactive gate lines to the number of all gate lines and a column of "ON DUTY" representing a ratio of the number of active gate lines to the number of all gate lines. The column of "AOR" may represent the ratio of the number of the inactive gate lines to the number of all gate lines. In addition, the column of "AOR" may represent the ratio of the inactive period of the emission signal to an entire period of the emission signal. The column of "ON DUTY" may represent the ratio of the number of the active gate lines to the number of all gate lines. In addition, the column of "ON DUTY" may represent the ratio of the active period of the emission signal to an entire period of the emission signal and the active period of the emission signal.

The driving controller 200 may determine the number of emission of the emission signal EM in the single frame FRAME according to the luminance LUMINANCE of the display image. In a first luminance range (e.g. a high luminance range of FIG. 12) of the display image, the number of emission of the emission signal EM in the single frame FRAME may be a first number of emission (e.g. AID CYCLE of one in FIG. 12). In a second luminance range (e.g. a middle luminance range of FIG. 12) of the display image having a luminance less than a luminance of the first luminance range (e.g. the high luminance range of FIG. 12), the number of emission of the emission signal EM in the single frame FRAME may be a second number of emission (e.g. AID CYCLE of four in FIG. 12) which is greater than the first number of emission (e.g. AID CYCLE of one in FIG. 12). In a third luminance range (e.g. an extremely low luminance range of FIG. 12) of the display image having a luminance less than a luminance of the second luminance range (e.g. the middle luminance range of FIG. 12), the number of emission of the emission signal EM in the single frame FRAME may be a third number of emission (e.g. AID CYCLE of one in FIG. 12) which is less than the second number of emission (e.g. AID CYCLE of four in FIG. 12).

Herein, the first number of emission may be equal to or greater than one, the second number of emission may be greater than one and the third number of emission may be equal to or greater than one. In an exemplary embodiment, the first number of emission may be equal to the third number of emission, for example. In an exemplary embodiment, the first number of emission and the third number of emission may be one, for example. In addition, the second number of emission may be determined among numbers greater than one. The second number of emission may be determined according to a cycle of the clock signal for generating the emission signal EM.

In the illustrated exemplary embodiment, the first number of emission and the third number of emission are one and the second number of emission is four. A luminance boundary where the number of emission is changed may be defined as an AID CYCLE threshold. In the illustrated exemplary embodiment, the number of emission is changed from one to four and from four to one (1-4-1) so that the AID CYCLE threshold may have a first threshold value where the number of emission is changed from one to four and a second threshold value where the number of emission is changed from four to one.

When the pixel emits light in plural times (e.g. four times) in the single frame FRAME in the middle luminance range, the instantaneous afterimage and the flicker may be prevented and the motion clarity may be enhanced similarly to a case of increasing a driving frequency.

However, when the pixel emits light in plural times in the single frame FRAME in the extremely low luminance range, the color blurring may be occurred due to the varying response speeds according to colors of the organic light emitting elements as explained in FIG. 11. Thus, the pixel may emit in a single time in the single frame FRAME in the extremely low luminance range to prevent the color blurring.

In an exemplary embodiment, the pixel may emit in a single time in the single frame FRAME in the high luminance range (e.g. from 420 nit to 387 nit) in FIG. 12, for example. In an exemplary embodiment, the pixel may emit in four times in the single frame FRAME in the middle luminance range (e.g. from 380 nit to 10 nit) in FIG. 12, for example. In an exemplary embodiment, the pixel may emit in a single time in the single frame FRAME in the extremely low luminance range (e.g. less than 10 nit) in FIG. 12, for example.

In an exemplary embodiment, when the luminance of the display image is 420 nit in FIG. 12, AOR CODE representing the number of inactive gate lines among all gate lines may be 22, for example. Although the display image represents a maximum luminance of 420 nit, 22 gate lines may be inactive. When the number of all gate lines is 1560, AOR representing the ratio of the number of the inactive gate lines to the number of the all gate lines may be about 1% (22/1560). In addition, ON DUTY representing the ratio of the number of the active gate lines and the number of the all gate lines may be about 99% (1538/1560).

As shown in FIG. 12, when the luminance of the display image is 420 nit, AID CYCLE is one and AOR is 1%. Herein, the emission signal EM may have a waveform like FIG. 13.

In an exemplary embodiment, when the luminance of the display image is 395 nit in FIG. 12, AOR CODE representing the number of inactive gate lines among all gate lines may be 32, for example. When the number of all gate lines is 1560, AOR representing the ratio of the number of the inactive gate lines to the number of the all gate lines may be about 2% (32/1560). In addition, ON DUTY representing the ratio of the number of the active gate lines to the number of the all gate lines may be about 98% (1528/1560).

As shown in FIG. 12, when the luminance of the display image is 395 nit, AID CYCLE is one and AOR is 2%. Herein, the emission signal EM may have a waveform like FIG. 14.

In an exemplary embodiment, when the luminance of the display image is 387 nit in FIG. 12, AOR CODE representing the number of inactive gate lines among all gate lines may be 85, for example. When the number of all gate lines is 1560, AOR representing the ratio of the number of the inactive gate lines to the number of the all gate lines may be about 5% (85/1560). In addition, ON DUTY representing the ratio of the number of the active gate lines to the number of the all gate lines may be about 95% (1475/1560).

As shown in FIG. 12, when the luminance of the display image is 387 nit, AID CYCLE is one and AOR is 5%. Herein, the emission signal EM may have a waveform like FIG. 15.

When AOR CODE representing the number of inactive gate lines among all gate lines is N for the maximum luminance (e.g. 420 nit in FIG. 12) of the display image, the second luminance range may start at a luminance having AOR CODE equal to or greater than 4N. In FIG. 12, AOR CODE for the maximum luminance of 420 nit is 22 so that the second luminance range may start at a luminance having AOR CODE equal to or greater than 88. Thus, the second luminance range may start at a luminance of 380 nit and AID CYCLE of the second luminance range may be four.

In an exemplary embodiment, when the luminance of the display image is 380 nit in FIG. 12, AOR CODE representing the number of inactive gate lines among all gate lines may be 121, for example. When the number of all gate lines is 1560, AOR representing the ratio of the number of the inactive gate lines to the number of the all gate lines may be about 8% (121/1560). In addition, ON DUTY representing the ratio of the number of the active gate lines to the number of the all gate lines may be about 92% (1439/1560).

As shown in FIG. 12, when the luminance of the display image is 380 nit, AID CYCLE is four and AOR is 8%. Herein, the emission signal EM may have a waveform like FIG. 16.

The emission signal EM may have a first emission inactive period and a second emission inactive period in the frame FRAME for the second luminance range of the display image. In the first emission inactive period, the gate signal may be activated. In the second emission inactive period, the gate signal may not be activated.

In FIG. 16, the emission signal EM may have four emission active periods and four emission inactive periods in the single frame FRAME. Thus, in FIG. 16, the emission signal EM may have a first emission inactive period, a second emission inactive period, a third emission inactive period and a fourth emission inactive period in the frame FRAME. In the first emission inactive period, the gate signal may be activated. In the second to fourth emission inactive periods, the gate signal may not be activated.

In an exemplary embodiment, when the luminance of the display image is 2 nit in FIG. 12, AOR CODE representing the number of inactive gate lines among all gate lines may be 1527, for example. When the number of all gate lines is 1560, AOR representing the ratio of the number of the inactive gate lines to the number of the all gate lines may be about 98% (1527/1560). In addition, ON DUTY representing the ratio of the number of the active gate lines to the number of the all gate lines may be about 2% (33/1560).

As shown in FIG. 12, when the luminance of the display image is 2 nit, AID CYCLE is one and AOR is 98%. Herein, the emission signal EM may have a waveform like FIG. 17.

The luminance LUMINANCE of the display image may be determined by a user luminance setting DBV set by a user. In an exemplary embodiment, the user luminance setting DBV may be transmitted from the host 700 to the driving controller 200, for example. The luminance LUMINANCE of the display image may be varied according to the user luminance setting DBV in real time.

In an alternative exemplary embodiment, the luminance LUMINANCE of the display image may be determined by the input image data IMG. The driving controller 200 may analyze the input image data IMG to determine the luminance LUMINANCE of the display image. The luminance LUMINANCE of the display image may be varied according to the input image data IMG in real time.

According to the illustrated exemplary embodiment, the number of emission of the emission signal EM in the single frame FRAME varies according to a luminance of the display image. The pixel may emit the light in plural times in the single frame for the middle luminance range so that the instantaneous afterimage and the flicker may be prevented and the motion clarity may be enhanced. In addition, the pixel may emit the light in a single time in the single frame for an extremely low luminance range so that a color blurring may be prevented. Therefore, the display quality of the display panel 100 may be enhanced.

FIG. 18 is a table representing an exemplary embodiment of the number of emission, AOR CODE, AOR and ON DUTY determined by a driving controller 200 of a display apparatus according to the luminance of a display image according to the invention.

The display apparatus and the method of driving the display panel according to the illustrated exemplary embodiment is substantially the same as the display apparatus and the method of driving the display panel of the previous exemplary embodiment explained referring to FIGS. 1 to 17 except AID CYCLE according to the luminance of the display image. Thus, the same reference numerals will be used to refer to the same or like parts as those described in the previous exemplary embodiment of FIGS. 1 to 17 and any repetitive explanation concerning the above elements will be omitted.

Referring to FIGS. 1 to 11 and 18, the table in FIG. 18 includes a column of "LUMINANCE" representing the luminance of the display image, a column of "AID CYCLE" representing the number of emission in the single frame FRAME, a column of "AOR CODE" representing the number of inactive gate lines among all gate lines, a column of "AOR" representing a ratio of the number of the number of the inactive gate lines to all gate lines and a column of "ON DUTY" representing a ratio of the number of active gate lines to the number of all gate lines. The column of "AOR" may represent the ratio of the number of the inactive gate lines to the number of all gate lines. In addition, the column of "AOR" may represent the ratio of the inactive period of the emission signal to an entire period of the emission signal. The column of "ON DUTY" may represent the ratio of the number of the active gate lines to the number of all gate lines. In addition, the column of "ON DUTY" may represent the ratio of the active period of the emission signal to an entire period of the emission signal.

The driving controller 200 may determine the number of emission of the emission signal EM in the single frame FRAME according to the luminance LUMINANCE of the display image. In a first luminance range (e.g. a high luminance range of FIG. 18) of the display image, the number of emission of the emission signal EM in the single frame FRAME may be a first number of emission (e.g. AID CYCLE of one in FIG. 18). In a second luminance range (e.g. a middle-high luminance range of FIG. 18) of the display image having a luminance less than a luminance of the first luminance range (e.g. the high luminance range of FIG. 18), the number of emission of the emission signal EM in the single frame FRAME may be a second number of emission (e.g. AID CYCLE of four in FIG. 18) which is greater than the first number of emission (e.g. AID CYCLE of one in FIG. 18). In a third luminance range (e.g. an extremely low luminance range of FIG. 18) of the display image having a luminance less than a luminance of the second luminance range (e.g. the middle luminance range of FIG. 18), the number of emission of the emission signal EM in the single frame FRAME may be a third number of emission (e.g. AID CYCLE of one in FIG. 18) which is less than the second number of emission (e.g. AID CYCLE of four in FIG. 18).

In a fourth luminance range (e.g. a middle-low luminance range of FIG. 18) of the display image having a luminance less than a luminance of the second luminance range (e.g. the middle-high luminance range of FIG. 18) and greater than a luminance of the third luminance range (e.g. the extremely low luminance range of FIG. 18), the number of emission of the emission signal EM in the single frame FRAME may be a fourth number of emission (e.g. AID CYCLE of eight in FIG. 18) which is greater than the second number of emission (e.g. AID CYCLE of four in FIG. 18).

Herein, for example, the first number of emission may be equal to the third number of emission. In an exemplary embodiment, the first number of emission and the third number of emission may be one, for example. In addition, the second number of emission may be determined among numbers greater than one. The second number of emission may be determined according to a cycle of the clock signal for generating the emission signal EM. In an exemplary embodiment, the fourth number of emission may be a multiple of the second number of emission, for example.

In the illustrated exemplary embodiment, the first number of emission and the third number of emission are one, the second number of emission is four and the fourth number of emission is eight. A luminance boundary where the number of emission is changed may be defined as an AID CYCLE threshold. In the illustrated exemplary embodiment, the number of emission is changed from one to four, from four to eight and from eight to one (1-4-8-1) so that the AID CYCLE threshold may have a first threshold value where the number of emission is changed from one to four, a second threshold value where the number of emission is changed from four to eight and a third threshold value where the number of emission is changed from eight to one.

When the pixel emits light in plural times (e.g. four times) in the single frame FRAME in the middle-high luminance range, the instantaneous afterimage and the flicker may be prevented and the motion clarity may be enhanced similarly to a case of increasing a driving frequency.

When the pixel emits light in plural times (e.g. eight times) in the single frame FRAME in the middle-low luminance range, the instantaneous afterimage and the flicker may be further prevented and the motion clarity may be further enhanced similarly to a case of increasing the driving frequency.

However, when the pixel emits light in plural times in the single frame FRAME in the extremely low luminance range, the color blurring may be occurred due to the varying response speeds according to colors of the organic light emitting elements as explained in FIG. 11. Thus, the pixel may emit in a single time in the single frame FRAME in the extremely low luminance range to prevent the color blurring.

According to the illustrated exemplary embodiment, the number of emission of the emission signal EM in the single frame FRAME varies according to a luminance of the display image. The pixel may emit the light in plural times in the single frame for the middle-high luminance range and the middle-low luminance range so that the instantaneous afterimage and the flicker may be prevented and the motion clarity may be enhanced. In addition, the pixel may emit the light in a single time in the single frame for an extremely low luminance range so that a color blurring may be prevented. Therefore, the display quality of the display panel 100 may be enhanced.

FIG. 19 is a table representing an exemplary embodiment of the number of emission, AOR CODE, AOR and ON DUTY determined by a driving controller of a display apparatus according to the invention according to the luminance of a display image.

The display apparatus and the method of driving the display panel according to the illustrated exemplary embodiment is substantially the same as the display apparatus and the method of driving the display panel of the previous exemplary embodiment explained referring to FIGS. 1 to 17 except AID CYCLE according to the luminance of the display image. Thus, the same reference numerals will be used to refer to the same or like parts as those described in the previous exemplary embodiment of FIGS. 1 to 17 and any repetitive explanation concerning the above elements will be omitted.

Referring to FIGS. 1 to 11 and 19, the table in FIG. 19 includes a column of "LUMINANCE" representing the luminance of the display image, a column of "AID CYCLE" representing the number of emission in the single frame FRAME, a column of "AOR CODE" representing the number of inactive gate lines among all gate lines, a column of "AOR" representing a ratio of the number of the inactive gate lines to the number of all gate lines and a column of "ON DUTY" representing a ratio of and the number of active gate lines to the number of all gate lines. The column of "AOR" may represent the ratio of the number of the inactive gate lines to the number of all gate lines. In addition, the column of "AOR" may represent the ratio of the inactive period of the emission signal to an entire period of the emission signal. The column of "ON DUTY" may represent the ratio of the number of the active gate lines to the number of all gate lines. In addition, the column of "ON DUTY" may represent the ratio of the active period of the emission signal to an entire period of the emission signal.

The driving controller 200 may determine the number of emission of the emission signal EM in the single frame FRAME according to the luminance LUMINANCE of the display image. In a first luminance range (e.g. a high luminance range of FIG. 19) of the display image, the number of emission of the emission signal EM in the single frame FRAME may be a first number of emission (e.g. AID CYCLE of one in FIG. 19). In a second luminance range (e.g. a middle-high luminance range of FIG. 19) of the display image having a luminance less than a luminance of the first luminance range (e.g. the high luminance range of FIG. 19), the number of emission of the emission signal EM in the single frame FRAME may be a second number of emission (e.g. AID CYCLE of four in FIG. 19) which is greater than the first number of emission (e.g. AID CYCLE of one in FIG. 19). In a third luminance range (e.g. an extremely low luminance range of FIG. 19) of the display image having a luminance less than a luminance of the second luminance range (e.g. the middle luminance range of FIG. 19), the number of emission of the emission signal EM in the single frame FRAME may be a third number of emission (e.g. AID CYCLE of one in FIG. 19) which is less than the second number of emission (e.g. AID CYCLE of four in FIG. 18).

In a fourth luminance range (e.g. a middle luminance range of FIG. 19) of the display image having a luminance less than a luminance of the second luminance range (e.g. the middle-high luminance range of FIG. 19) and greater than a luminance of the third luminance range (e.g. the extremely low luminance range of FIG. 19), the number of emission of the emission signal EM in the single frame FRAME may be a fourth number of emission (e.g. AID CYCLE of eight in FIG. 19) which is greater than the second number of emission (e.g. AID CYCLE of four in FIG. 19).

In a fifth luminance range (e.g. a middle-low luminance range of FIG. 19) of the display image having a luminance less than a luminance of the fourth luminance range (e.g. the middle luminance range of FIG. 19) and greater than a luminance of the third luminance range (e.g. the extremely low luminance range of FIG. 19), the number of emission of the emission signal EM in the single frame FRAME may be a fifth number of emission (e.g. AID CYCLE of four in FIG. 19) which is less than the fourth number of emission (e.g. AID CYCLE of eight in FIG. 19) and greater than the third number of emission (e.g. AID CYCLE of one in FIG. 19).

Herein, for example, the first number of emission may be equal to the third number of emission. In an exemplary embodiment, the first number of emission and the third number of emission may be one, for example. In addition, the second number of emission may be determined among numbers greater than one. The second number of emission may be determined according to a cycle of the clock signal for generating the emission signal EM. In an exemplary embodiment, the fourth number of emission may be a multiple of the second number of emission, for example. In an exemplary embodiment, the fifth number of emission may be equal to the second number of emission.

In the illustrated exemplary embodiment, the first number of emission and the third number of emission are one, the second number of emission and the fifth number of emission is four and the fourth number of emission is eight. A luminance boundary where the number of emission is changed may be defined as an AID CYCLE threshold. In the illustrated exemplary embodiment, the number of emission is changed from one to four, from four to eight, from eight to four and from four to one (1-4-8-4-1) so that the AID CYCLE threshold may have a first threshold value where the number of emission is changed from one to four, a second threshold value where the number of emission is changed from four to eight, a third threshold value where the number of emission is changed from eight to four and a fourth threshold value where the number of emission is changed from four to one.

When the pixel emits light in plural times (e.g. four times) in the single frame FRAME in the middle-high luminance range, the instantaneous afterimage and the flicker may be prevented and the motion clarity may be enhanced similarly to a case of increasing a driving frequency.

When the pixel emits light in plural times (e.g. eight times) in the single frame FRAME in the middle luminance range, the instantaneous afterimage and the flicker may be further prevented and the motion clarity may be further enhanced similarly to a case of increasing the driving frequency.

When the pixel emits light in plural times (e.g. four times) in the single frame FRAME in the middle-low luminance range, the instantaneous afterimage and the flicker may be further prevented and the motion clarity may be further enhanced similarly to a case of increasing the driving frequency. In addition, when the AID cycle is converted from eight to one, the user may perceive the change of the AID cycle so that the AID cycle may be converted from eight to four and from four to one.

However, when the pixel emits light in plural times in the single frame FRAME in the extremely low luminance range, the color blurring may be occurred due to the varying response speeds according to colors of the organic light emitting elements as explained in FIG. 11. Thus, the pixel may emit in a single time in the single frame FRAME in the extremely low luminance range to prevent the color blurring.

According to the illustrated exemplary embodiment, the number of emission of the emission signal EM in the single frame FRAME varies according to a luminance of the display image. The pixel may emit the light in plural times in the single frame for the middle-high luminance range, the middle luminance range and the middle-low luminance range so that the instantaneous afterimage and the flicker may be prevented and the motion clarity may be enhanced. In addition, the pixel may emit the light in a single time in the single frame for an extremely low luminance range so that a color blurring may be prevented. Therefore, the display quality of the display panel 100 may be enhanced.

In exemplary embodiments of the invention as explained above, the display quality of the display panel may be enhanced.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus comprising:
    a display panel comprising a gate line, a data line, an emission line and a pixel electrically connected to the gate line, the data line and the emission line;
    a gate driver which outputs a gate signal to the gate line;
    a data driver which outputs a data voltage to the data line;
    an emission driver which outputs an emission signal to the emission line; and
    a driving controller which determines a number of emission in a single frame of the emission signal according to a luminance of a display image,
    wherein the number of the emission in the single frame is a first number of emission in a first luminance range of the display image,
    wherein the number of the emission in the single frame is a second number of emission greater than the first number of the emission in a second luminance range of the display image having a luminance less than a luminance of the first luminance range, and
    wherein the number of the emission in the single frame is a third number of emission less than the second number of the emission in a third luminance range of the display image having a luminance less than the luminance of the second luminance range.

2. The display apparatus of claim 1, wherein the emission signal has a first emission inactive period and a second emission inactive period in the single frame for the second luminance range of the display image,
    wherein the gate signal is activated in the first emission inactive period, and
    wherein the gate signal is inactivated in the second emission inactive period.

3. The display apparatus of claim 1, wherein the first number of the emission is equal to the third number of the emission.

4. The display apparatus of claim 3, wherein the first number of the emission and the third number of the emission are one.

5. The display apparatus of claim 4, wherein the second number of the emission is four.

6. The display apparatus of claim 1, wherein the number of the emission of the emission signal in the single frame is a fourth number of emission greater than the second number of the emission in a fourth luminance range of the display image having a luminance less than the luminance of the second luminance range and greater than the luminance of the third luminance range.

7. The display apparatus of claim 6, wherein the first number of the emission and the third number of the emission are one.

8. The display apparatus of claim 7, wherein the second number of the emission is four, and
    wherein the fourth number of the emission is eight.

9. The display apparatus of claim 6, wherein the number of the emission of the emission signal in the single frame is a fifth number of emission less than the fourth number of the emission and greater than the third number of the emission in a fifth luminance range of the display image having a luminance less than the luminance of the fourth luminance range and greater than the luminance of the third luminance range.

10. The display apparatus of claim 9, wherein the first number of the emission and the third number of the emission are one.

11. The display apparatus of claim 10, wherein the second number of the emission is four,
    wherein the fourth number of the emission is eight, and
    wherein the fifth number of the emission is four.

12. The display apparatus of claim 1, further comprising a plurality of gate lines,
    wherein when AOR CODE representing a number of inactive gate lines among the plurality of gate lines is N for a maximum luminance of the display image, the second luminance range starts at a luminance having the AOR CODE equal to or greater than 4N.

13. The display apparatus of claim 1, wherein the luminance of the display image is determined by a user luminance setting which is set by a user.

14. The display apparatus of claim 1, wherein the luminance of the display image is determined by input image data.

15. A method of driving a display panel, the method comprising:
    determining a number of emission in a single frame of an emission signal according to a luminance of a display image;
    outputting a gate signal to a gate line of the display panel;
    outputting a data voltage to a data line of the display panel; and outputting the emission signal to an emission line of the display panel, wherein the number of the emission in the single frame is a first number of the emission in a first luminance range of the display image, wherein the number of the emission in the single frame is a second number of the emission greater than the first number of the emission in a second luminance range of the display image having a luminance less than a luminance of the first luminance range, and wherein the number of the emission in the single frame is a third number of emission less than the second number of the emission in a third luminance range of the display image having a luminance less than the luminance of the second luminance range.

16. The method of claim 15, wherein the emission signal has a first emission inactive period and a second emission inactive period in the single frame for the second luminance range of the display image, wherein the gate signal is activated in the first emission inactive period, and wherein the gate signal is inactivated in the second emission inactive period.

17. The method of claim 15, wherein the first number of the emission is equal to the third number of the emission.

18. The method of claim 15, wherein the number of the emission of the emission signal in the single frame is a fourth number of emission greater than the second number of the emission in a fourth luminance range of the display image having a luminance less than the luminance of the second luminance range and greater than the luminance of the third luminance range.

19. The method of claim 18, wherein the number of the emission of the emission signal in the single frame is a fifth number of emission less than the fourth number of the emission and greater than the third number of the emission in a fifth luminance range of the display image having a luminance less than the luminance of the fourth luminance range and greater than the luminance of the third luminance range.

20. The method of claim 15, wherein when AOR CODE representing a number of inactive gate lines among a plurality of gate lines is N for a maximum luminance of the display image, the second luminance range starts at a luminance having the AOR CODE equal to or greater than 4N.

* * * * *